United States Patent

Kurose

(10) Patent No.: US 8,856,677 B2
(45) Date of Patent: Oct. 7, 2014

(54) ELECTRONIC TEXT VIEWING APPARATUS, ELECTRONIC TEXT VIEWING METHOD, AND MOBILE PHONE

(75) Inventor: Takahiro Kurose, Tokyo (JP)

(73) Assignee: NEC Corporation, Tokyo (JP)

( * ) Notice: Subject to any disclaimer, the term of this patent is extended or adjusted under 35 U.S.C. 154(b) by 197 days.

(21) Appl. No.: 12/742,373

(22) PCT Filed: Nov. 6, 2008

(86) PCT No.: PCT/JP2008/003205
§ 371 (c)(1),
(2), (4) Date: May 11, 2010

(87) PCT Pub. No.: WO2009/066420
PCT Pub. Date: May 28, 2009

(65) Prior Publication Data
US 2010/0257480 A1 Oct. 7, 2010

(30) Foreign Application Priority Data
Nov. 20, 2007 (JP) ................................. 2007-300023

(51) Int. Cl.
| | |
|---|---|
| G06F 3/048 | (2013.01) |
| G09G 5/00 | (2006.01) |
| G09G 5/02 | (2006.01) |
| G06F 17/21 | (2006.01) |
| G06F 3/0485 | (2013.01) |
| G06F 17/30 | (2006.01) |
| G09G 5/34 | (2006.01) |
| H04M 1/725 | (2006.01) |

(52) U.S. Cl.
CPC ............ *G06F 17/211* (2013.01); *G06F 3/0485* (2013.01); *G06F 17/30716* (2013.01); *G09G 5/34* (2013.01); *H04M 1/72522* (2013.01)

USPC ........... 715/784; 715/785; 715/786; 715/830; 345/684; 345/123; 345/688

(58) Field of Classification Search
CPC .... G06F 3/0485; G06F 17/30716; G09G 5/34
USPC .......... 715/784, 785, 786, 830; 345/341, 684, 345/123, 688
See application file for complete search history.

(56) References Cited

U.S. PATENT DOCUMENTS

| | | | | |
|---|---|---|---|---|
| 5,903,867 | A | * | 5/1999 | Watari et al. ................... 704/270 |
| 5,924,068 | A | * | 7/1999 | Richard et al. ................. 704/260 |

(Continued)

FOREIGN PATENT DOCUMENTS

| | | | | | |
|---|---|---|---|---|---|
| JP | 07152532 | A | * | 6/1995 | ............... G06F 3/16 |
| JP | 7-508364 | A | | 9/1995 | |

(Continued)

OTHER PUBLICATIONS

International Search Report for PCT/JP2008/003205, mailed Feb. 3, 2009.

(Continued)

*Primary Examiner* — Ece Hur
(74) *Attorney, Agent, or Firm* — Sughrue Mion, PLLC

(57) ABSTRACT

An electronic text viewing apparatus includes a viewing application unit that outputs viewing data for displaying a text in a viewable manner, a display unit that displays the viewing data and a fast reading button for receiving a fast reading request for the viewing data, a viewing data requesting unit that issues a request for acquirement of the viewing data to the viewing application unit, and acquires the viewing data to be viewed, a setting data storage unit that stores setting data for the acquired viewing data, and a fast reading viewer control unit that, when the fast reading button is pressed, converts the viewing data into fast reading viewer data by performing display format conversion, display speed control and scroll control of the viewing data, and displays the fast reading viewer data and a return button for converting the fast reading viewer data to the viewing data.

6 Claims, 6 Drawing Sheets

(56) References Cited

U.S. PATENT DOCUMENTS

| | | | |
|---|---|---|---|
| 6,161,093 A * | 12/2000 | Watari et al. | 704/270 |
| 6,259,432 B1 * | 7/2001 | Yamada et al. | 345/159 |
| 6,330,007 B1 * | 12/2001 | Isreal et al. | 715/762 |
| 6,337,694 B1 * | 1/2002 | Becker et al. | 345/684 |
| 6,409,513 B1 * | 6/2002 | Kawamura et al. | 434/178 |
| 6,493,734 B1 * | 12/2002 | Sachs et al. | 715/212 |
| 6,978,147 B2 * | 12/2005 | Coombes | 455/466 |
| 7,085,999 B2 * | 8/2006 | Maeda et al. | 715/236 |
| 7,555,727 B2 * | 6/2009 | Hawkins et al. | 715/816 |
| 7,605,827 B2 * | 10/2009 | Sugahara | 345/684 |
| 7,724,239 B2 * | 5/2010 | Fyke et al. | 345/167 |
| 7,881,582 B2 * | 2/2011 | Cragun et al. | 386/343 |
| 8,108,779 B1 * | 1/2012 | Rein et al. | 715/743 |
| 8,370,150 B2 * | 2/2013 | Toiyama et al. | 704/260 |
| 2001/0054049 A1 * | 12/2001 | Maeda et al. | 707/517 |
| 2003/0035063 A1 * | 2/2003 | Orr | 348/465 |
| 2003/0063136 A1 * | 4/2003 | J'maev | 345/864 |
| 2003/0076539 A1 * | 4/2003 | Nakajima | 358/2.1 |
| 2004/0025111 A1 * | 2/2004 | Park | 715/500 |
| 2004/0203959 A1 * | 10/2004 | Coombes | 455/466 |
| 2005/0195222 A1 * | 9/2005 | Sugahara | 345/684 |
| 2006/0036609 A1 * | 2/2006 | Suda et al. | 707/10 |
| 2006/0112351 A1 * | 5/2006 | Chen | 715/786 |
| 2006/0187202 A1 * | 8/2006 | Fyke et al. | 345/157 |
| 2006/0194181 A1 * | 8/2006 | Rosenberg | 434/317 |
| 2006/0277454 A1 * | 12/2006 | Chen | 715/500.1 |
| 2007/0052546 A1 * | 3/2007 | Minagawa et al. | 340/815.4 |
| 2009/0237422 A1 * | 9/2009 | Modi et al. | 345/685 |
| 2010/0125807 A1 * | 5/2010 | Easterday et al. | 715/785 |
| 2010/0280956 A1 * | 11/2010 | Chutorash et al. | 705/64 |

FOREIGN PATENT DOCUMENTS

| | | | | |
|---|---|---|---|---|
| JP | H9-265369 A | | 10/1997 | |
| JP | H11-305918 A | | 11/1999 | |
| JP | 2000-311045 A | | 11/2000 | |
| JP | 2001-022327 A | | 1/2001 | |
| JP | 2001-167107 A | | 6/2001 | |
| JP | 2002215447 A | * | 8/2002 | G06F 12/00 |
| JP | 2003-108487 A | | 4/2003 | |
| JP | 2004-118492 A | | 4/2004 | |
| JP | 2005-267049 A | | 9/2005 | |
| JP | 2006-014223 A | | 1/2006 | |

OTHER PUBLICATIONS

Japanese Office Action for JP Application No. 2009-542465 mailed on Aug. 6, 2013 with Partial English Translation.

* cited by examiner

FIG. 2

| ITEM | | CONTENTS |
|---|---|---|
| DISPLAY FORMAT CONVE-RSION | VERTICAL/ HORIZONTAL WRITING | ☐ VERTICAL WRITING<br>☐ HORIZONTAL WRITING |
| | USED FONT | ☐ ×××<br>☐ ○○○<br>☐ △△△ |
| | FONT SIZE | ☐ ×××<br>☐ ○○○<br>☐ △△△ |
| | SPACING OF LINES | ☐ ×××<br>☐ ○○○<br>☐ △△△ |
| DISPLAY SPEED CONVERSION | | ☐ ×××<br>☐ ○○○<br>☐ △△△ |
| SCROLL CONVERSION | | ☐ PAGE SCROLLING<br>☐ LINE SCROLLING |

ELECTRONIC TEXT VIEWING APPARATUS, ELECTRONIC TEXT VIEWING METHOD, AND MOBILE PHONE

TECHNICAL FIELD

The present invention relates to an electronic text viewing apparatus, an electronic text viewing method, an electronic text viewing program, and a mobile phone.

BACKGROUND ART

In recent years, the society is full of information such as information supplied via the Internet, as well as internal documents and external documents of corporations. How fast one can process such information is the key to an increase in work efficiency and higher performance at work. Personal computers have been used as major business tools. However, if mobile phones that can be carried around anywhere become capable of operating at a similar efficiency to the efficiency achieved with personal computers, the mobile phones will be regarded as the strongest tools as ever.

Fast reading is also regarded as one of the business skills. If one can perform fast reading, he/she achieves higher information collection speed, and accordingly, also achieves higher work performance. General users are also expected to read more often texts such as electronic books and news with mobile phones and the likes in the future.

In view of the above facts, there is a demand for development of a function that allows users, including people with fast reading performance of several thousands or tens of thousands of characters per minute, to efficiently view texts with mobile phones and the likes.

In such a case, when a user uses a mobile phone to view a text such as a mail or a document designed for viewing on a personal computer, it is difficult to read the text as fast as reading on a personal computer for the below-mentioned reasons.

First, each line of characters does not fit the screen size of a mobile phone, and a line feed is mechanically inserted to each line. As a result, it becomes difficult to read the text. More specifically, it becomes necessary to handle the scroll bar to scroll on the display screen and move the viewing area. This involves a complicated scrolling operation to scroll on the display screen.

Furthermore, when there are columns or the subject document has a two-column or three-column format, for example, the reader needs to often perform the operation to move the viewing position from the bottom to the top of a page or starts reading the top of the second column after reading the bottom of the first column.

Moreover, since the number of characters that can be displayed on the entire screen is limited, the operation to switch the viewing area on the screen needs to be often performed to read a large volume of texts created with a personal computer.

Furthermore, it is necessary to get accustomed to the key operations necessary for viewing, such as enlarged or reduced display. The already mentioned problems are caused mainly by the time loss due to such manual operations by the user.

To counter the above problems and circumstances, the following techniques have been suggested in Patent Documents.

Patent Document 1 discloses a data display device that increases the operability by improving visibility when scrolling through text data. The data display device disclosed in Patent Document 1 displays one line and scrolls to left. In this data display device, not only the shift time of the display dots but also the shift intervals can be changed.

Patent Document 2 discloses a data display device that can satisfy the needs of users while improving the operability in display format changing operations and character size changing operations. The data display device disclosed in Patent Document 2 displays the characters of one screen by scrolling backward from a state displayed in "large size/scroll view" and switching to "small size/normal viewing", and displaying backward from the last character of the display contents at the time of the scroll display.

Patent Document 3 discloses a portable information device that facilitates changes by a user in the portions to be displayed in an enlarged view of the information displayed as a list. The portable information device disclosed in Patent Document 3 displays a total display screen and a partial enlarged screen as well as a file name display column on the display screen. The total display screen is a screen to display the entire document that is currently being viewed. This total display screen also displays a magnified image, and the portion mainly showing the magnified image is enlarged and displayed on the partial enlarged screen. On the partial enlarged screen, scrolling to right is continuously performed, and, accordingly, the viewing position of the magnified image on the total display screen also moves to right.

Patent Document 4 discloses a portable terminal that allows a user to readily move the viewing area of text data and the cursor with one hand. The portable terminal disclosed in Patent Document 4 includes a CPU for performing main processing, a memory that stores data, a display unit that displays data on its display screen, and a display control unit that controls the display unit. This portable terminal displays the data too large to fit the size of the display unit by scrolling through the data on the display screen. This portable terminal also includes a tilt detection unit that detects the tilt angle of its main body tilting in a predetermined direction, and causes the display unit to display the scrolled display screen based on the tilt angle of the main body.

[Patent Document 1] Japanese Laid-open Patent Publication No. 2000-311045

[Patent Document 2] Japanese Laid-open Patent Publication No. 2001-022327

[Patent Document 3] Japanese Laid-open Patent Publication No. 2005-267049

[Patent Document 4] Japanese Laid-open Patent Publication No. H11-305918

SUMMARY

However, the structure disclosed in Patent Document 1 improves the visibility of the scrolling of text data, but cannot eliminate the complexity of scrolling operations at the time of viewing and cannot enable efficient viewing of texts.

The structure disclosed in Patent Document 2 can improve the operability when the display format or the character size is changed. However, this structure cannot eliminate the complexity of display format changing operations and character size changing operations, and cannot enable efficient viewing of texts.

The structure disclosed in Patent Document 3 facilitates changes in each portion displayed in an enlarged view. However, this structure cannot eliminate the complexity of enlarged displaying operations, and cannot enable efficient viewing of texts.

The structure disclosed in Patent Document 4 scroll through the data based on the tilt angle of the main body.

However, this structure requires the tilting process, and cannot eliminate the complexity of scrolling and cannot enable efficient viewing of texts.

The present invention has been made in view of the above circumstances, and the object thereof is to provide an electronic text viewing apparatus that eliminates complexity of operations and can facilitate efficient viewing of electronic texts, and to provide an electronic text viewing method, an electronic text viewing program, and a mobile phone.

According to the present invention, there is provided an electronic text viewing apparatus including:

a viewing application unit that outputs viewing data for displaying a text in a viewable manner;

a display unit that displays the viewing data and a fast reading button for receiving a fast reading request for the viewing data;

a viewing data requesting unit that issues a request for acquirement of the viewing data to the viewing application unit, and acquires the viewing data to be viewed;

a setting data storage unit that stores setting data that is used for performing a display format conversion, a display speed conversion, and a scroll conversion on the acquired viewing data; and a fast reading viewer control unit that, when the fast reading button is pressed, converts the viewing data acquired by the viewing data requesting unit into fast reading viewer data by referring to the stored setting data, converting the display format of the viewing data, controlling the display speed of the viewing data, and controlling the scrolling of the viewing data, and displays the fast reading viewer data and a return button for converting the fast reading viewer data to the viewing data.

According to the present invention, there is provided an electronic text viewing method including:

performing a viewing application which outputs viewing data for displaying a text in a viewable manner;

displaying the viewing data and a fast reading button for receiving a fast reading request for the viewing data;

in said viewing application, issuing a request for acquirement of the viewing data, to acquire the viewing data to be viewed;

storing setting data that is used for performing a display format conversion, a display speed conversion, and a scroll conversion on the viewing data acquired; and when the fast reading button is pressed, converting the acquired viewing data into fast reading viewer data by referring to the stored setting data, converting the display format of the viewing data, controlling the display speed of the viewing data, and controlling the scrolling of the viewing data, and displaying the fast reading viewer data and a return button for converting the fast reading viewer data to the viewing data.

According to the present invention, there is provided an electronic text viewing program causing a computer to:

view application for outputting viewing data for displaying a text in a viewable manner;

display the viewing data and a fast reading button for receiving a fast reading request for the viewing data;

in said viewing application, issue a request for acquirement of the viewing data, and acquire the viewing data to be viewed;

store setting data that is used for performing a display format conversion, a display speed conversion, and a scroll conversion on the viewing data acquired; and when the fast reading button is pressed, convert the viewing data acquired into fast reading viewer data by referring to the stored setting data, converting the display format of the viewing data, controlling the display speed of the viewing data, and controlling the scrolling of the viewing data, and display the fast reading viewer data and a return button for converting the fast reading viewer data to the viewing data.

According to the present invention, there is provided a mobile phone including:

a viewing application unit that outputs viewing data for displaying a text in a viewable manner;

a display unit that displays the viewing data and a fast reading button for receiving a fast reading request for the viewing data;

a viewing data requesting unit that issues a request for acquirement of the viewing data to the viewing application unit, and acquires the viewing data to be viewed;

a setting data storage unit that stores setting data that is used for performing a display format conversion, a display speed conversion, and a scroll conversion on the viewing data acquired; and a fast reading viewer control unit that, when the fast reading button is pressed, converts the viewing data acquired by the viewing data requesting unit into fast reading viewer data by referring to the stored setting data, converting the display format of the viewing data, controlling the display speed of the viewing data, and controlling the scrolling of the viewing data, and displays the fast reading viewer data and a return button for converting the fast reading viewer data to the viewing data.

As described above, the present invention provides an electronic text viewing apparatus that eliminates complexity of operations and enables efficient viewing of electronic texts, and further provides an electronic text viewing method, an electronic text viewing program, and a mobile phone.

BRIEF DESCRIPTION OF THE DRAWINGS

The above and other objects, features, and advantages of the present invention will become more apparent from the following detailed description taken in conjunction with the accompanying drawings.

FIG. 2 is a diagram for explaining the setting data stored in the setting data storage unit of FIG. 1.

BEST MODE FOR CARRYING OUT THE INVENTION

Figure 1:
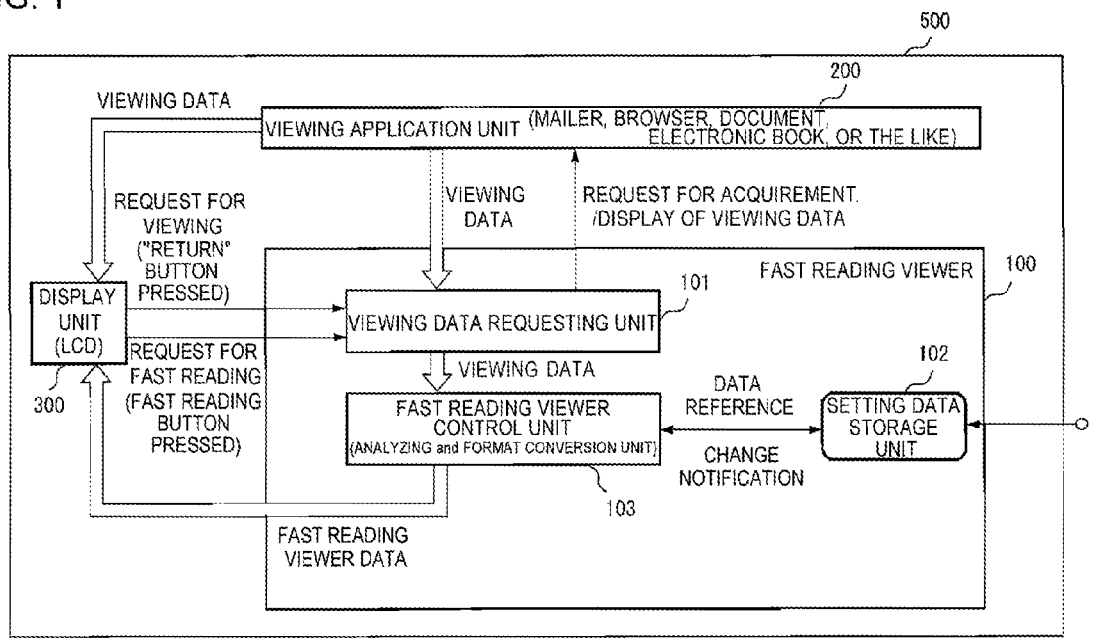
FIG. 1 is a block diagram schematically showing the structure of an electronic text viewing apparatus according to the present invention.

The following is a description of exemplary embodiments of the present invention, with reference to the accompanying drawings. Like components are denoted by like reference numerals in the drawings, and description of them will not be repeated.

First Exemplary Embodiment

FIG. 1 is a block diagram schematically showing the structure of an electronic text viewing apparatus 500 that is mounted on a mobile phone and functions as a fast reading viewer according to the present invention.

As shown in FIG. 1, the electronic text viewing apparatus 500 includes a fast reading viewer 100, a viewing application unit 200, and a display unit 300. The viewing application unit 200 and the display unit 300 belong to the mobile phone. Therefore, the electronic text viewing apparatus 500 uses the viewing application unit 200 and the display unit 300 provided on the mobile phone.

The fast reading viewer 100 includes a viewing data requesting unit 101, a setting data storage unit 102, and a fast reading viewer control unit 103. The fast reading viewer 100 reads viewing data from the viewing application unit 200, and converts the viewing data into fast reading viewer data. The converted fast reading viewer data is displayed on the display unit 300. The fast reading viewer 100 can perform this operation, since the CPU (Central Processing Unit) reads a program from a ROM (Read Only Memory) and executes the program.

The viewing application unit 200 is a function that is mounted on the mobile phone, and is an application (software) that enables viewing of electronic texts such as mail, browsers, documents, and electronic books.

The display unit 300 is a function that is mounted on the mobile phone, and is formed with a LCD (Liquid Crystal Display), for example.

The viewing data requesting unit 101 issues a viewing data acquirement request to the viewing application unit 200, and then acquires data to be viewed from the viewing application unit 200. The viewing data requesting unit 101 also issues a viewing data display request, and causes the display unit 300 to display the viewing data through the viewing application unit 200.

The setting data storage unit 102 stores setting data about display format conversions, display speed conversions, and scroll conversions. When there is a change in the setting data stored in the setting data storage unit 102, the setting data storage unit 102 notifies the fast reading viewer control unit 103 that a change is to be made to the data.

When the viewing data is input through the viewing data requesting unit 101, the fast reading viewer control unit 103 analyzes the viewing data. The fast reading viewer control unit 103 refers to the setting data stored in the setting data storage unit 102, and converts the analyzed data into fast reading viewer data. The converted fast reading viewer data is displayed on the display unit 300.

FIG. 2 is a diagram for explaining the setting data stored in the setting data storage unit 102 (FIG. 1). As shown in FIG. 2, in the setting data storage unit 102, the selection information about vertical/horizontal display, the selection information about the used font, the selection information about the font size, and the selection information about the spacing of the lines are stored in the rows of the setting items of display format conversions. The selection information about the display speed, such as 2000 characters per minute, is stored in the row of the setting items of display speed conversions. The selection information about page scrolling/row scrolling is stored in the row of the setting items of scrolling conversions.

Figure 3:
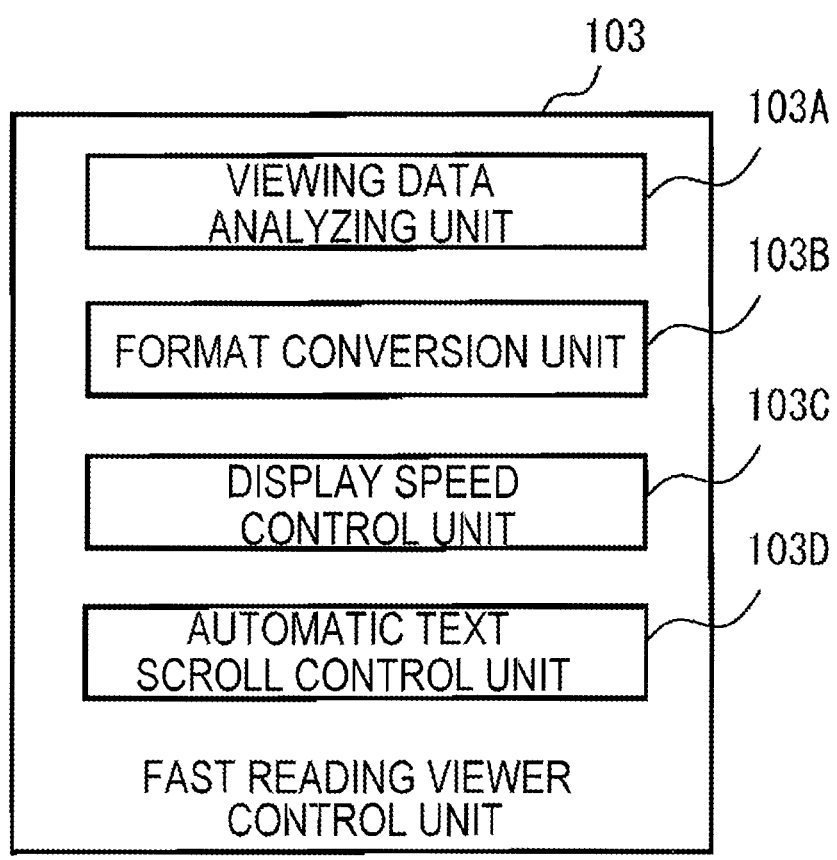
FIG. 3 is a block diagram schematically showing the structure of the fast reading viewer control unit of FIG. 1.

FIG. 3 is a block diagram schematically showing the structure of the fast reading viewer control unit 103 (FIG. 1). As shown in FIG. 3, the fast reading viewer control unit 103 includes a viewing data analyzing unit 103A, a format conversion unit 103B, a display speed control unit 103C, and an automatic text scroll control unit 103D.

The viewing data analyzing unit 103A analyzes input viewing data, and extracts only the text when the input viewing data contains a drawing or picture.

The format conversion unit 103B refers to the setting data about the display format conversions stored in the setting data storage unit 102 for the text extracted by the viewing data analyzing unit 103A. The format conversion unit 103B then performs a vertical/horizontal display conversion, a used font conversion, a font size conversion, and a line spacing conversion.

The display speed control unit 103C refers to the setting data about the display speed conversions stored in the setting data storage unit 102 for the text converted by the format conversion unit 103B. The display speed control unit 103C then controls the display speed (at 2000 characters per minute, for example).

The automatic text scroll control unit 103D refers to the setting data about the scroll conversions stored in the setting data storage unit 102 for the text subjected to the display speed control by the display speed control unit 103C. The automatic text scroll control unit 103D then controls page scrolling or row scrolling.

Figure 4:
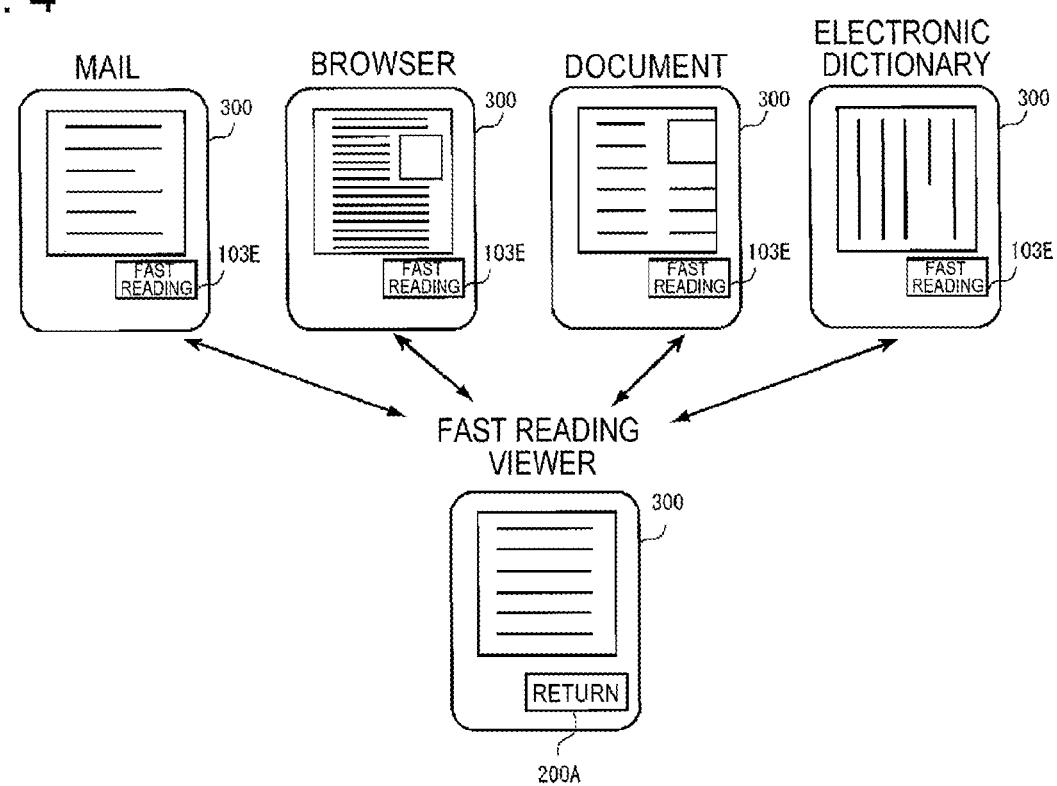
FIG. 4 is a diagram for explaining switched states of a viewing screen and a fast reading viewer screen on the display unit of FIG. 1.

FIG. 4 is a diagram for explaining the switched states of the viewing display and the fast reading viewer display on the display unit 300. As shown in FIG. 4, the display unit 300 displays an electronic text of a mail, a browser, a document, or an electronic dictionary (an electronic book) as the viewing data, for example. The display unit 300 also displays the fast reading viewer switched to the fast reading viewer display.

A fast reading button 103E is displayed on each display screen of the viewing data on the display unit 300. When the fast reading button 103E on a viewing data display screen is pressed, the display unit 300 switches from the viewing data display screen to the fast reading viewer display screen.

A return button 200A is displayed on the fast reading viewer display screen. When the return button 200A on the fast reading viewer display screen is pressed, the display unit 300 switches from the fast reading viewer display screen to the viewing data display screen.

Figure 5:
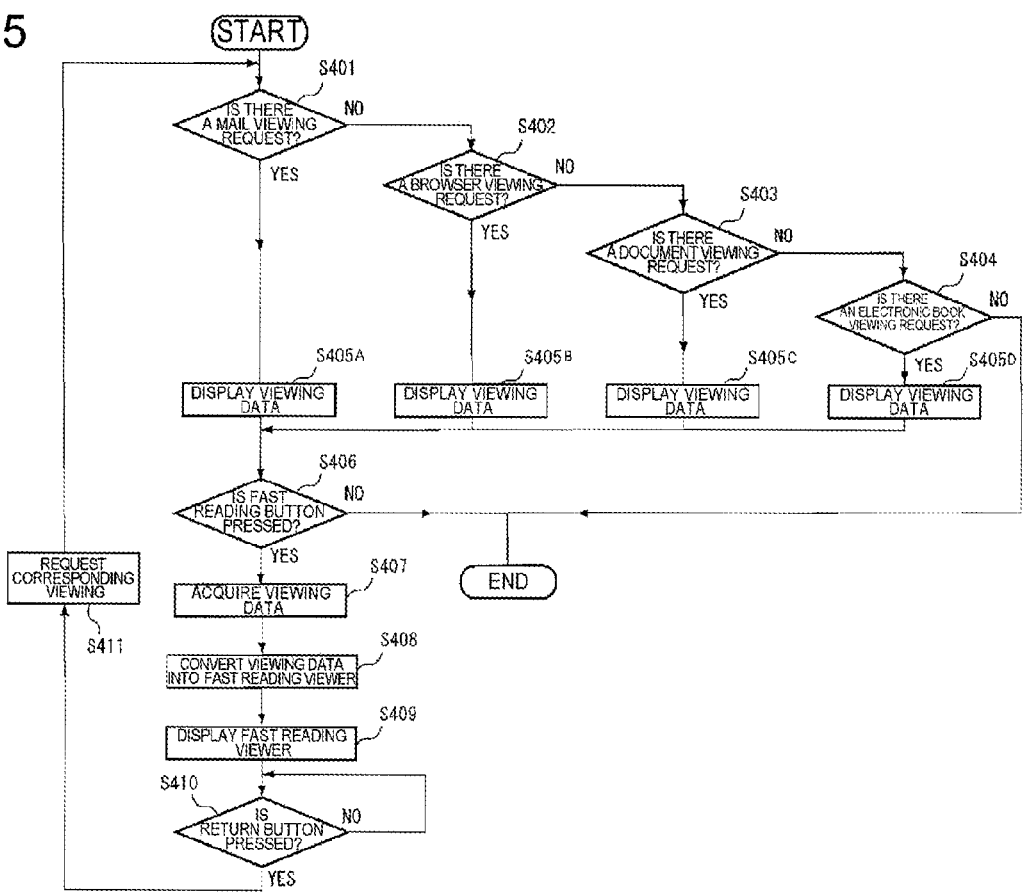
FIG. 5 is a flowchart showing a series of operations to be performed by the electronic text viewing apparatus of FIG. 1.

FIG. 5 is a flowchart showing a series of operations to be performed by the electronic text viewing apparatus 500 illustrated in FIG. 1.

As shown in FIG. 5, at step S401, the viewing application unit 200 (FIG. 1) determines whether there is a mail viewing request. When there is a mail viewing request ("YES" at step S401), the operation moves on to step S405A (viewing data display). When there is not a mail viewing request ("NO" at step S401), the operation moves on to step S402.

At step S402, the viewing application unit 200 determines whether there is a browser viewing request. When there is a browser viewing request ("YES" at step S402), the operation moves on to step S405B (viewing data display). When there is not a browser viewing request ("NO" at step S402), the operation moves on to step S403.

At step S403, the viewing application unit 200 (FIG. 1) determines whether there is a document viewing request. When there is a document viewing request ("YES" at step S403), the operation moves on to step S405C (viewing data display). When there is not a document viewing request ("NO" at step S403), the operation moves on to step S404.

At step S404, the viewing application unit 200 (FIG. 1) determines whether there is an electronic book viewing request. When there is an electronic book viewing request ("YES" at step S404), the operation moves on to step S405D (viewing data display). When there is not an electronic book viewing request ("NO" at step S404), the operation comes to an end.

At each of steps S405A through S405D, the viewing application unit 200 displays the requested viewing data on the display unit 300. For example, at step S405A, the viewing application unit 200 displays the requested mail on the display unit 300. At step S405B, the viewing application unit 200 displays the requested browser on the display unit 300. At step S405C, the requested document is displayed on the display unit 300. At step S405D, the viewing application unit 200 displays the requested electronic book on the display unit 300.

At step S406, the viewing data requesting unit 101 determines whether the fast reading button 103E is pressed on the viewing data screen displayed on the display unit 300. When the fast reading button 103E is not pressed ("NO" at step S406), the operation of the viewing data requesting unit 101 comes to an end.

When the fast reading button 103E is pressed ("YES" at step S406), the display unit 300 issues a request for a fast reading viewer to the viewing data requesting unit 101, and, in response to the fast reading viewer request, the viewing data requesting unit 101 issues a request for viewing data acquirement to the viewing application unit 200. The viewing data requesting unit 101 then acquires viewing data from the viewing application unit 200 (step S407).

At step S408, the fast reading viewer control unit 103 receives the viewing data from the viewing data requesting unit 101. The fast reading viewer control unit 103 refers to the setting data storage unit 102, and converts the viewing data into fast reading viewer data.

At step S409, the fast reading viewer control unit 103 transmits the fast reading viewer data to the display unit 300, and the display unit 300 displays the fast reading data as the fast reading viewer.

At step S410, the display unit 300 determines whether the return button 200A on the fast reading viewer screen displayed on the display unit 300 is pressed. When the return button 200A is not pressed ("NO" at step S410), the fast reading viewer screen remains on the display unit 300.

When the return button 200A is pressed ("YES" at step S410), the display unit 300 issues a viewing request for the corresponding viewing data converted into the fast reading viewer data (step S411), and the operation returns to step S401. This is because the user who has been watching the fast reading viewer screen might wish to return from the fast reading viewer to the viewing data display screen to see the non-extracted drawing or picture.

As described above, according to this exemplary embodiment, the electronic text viewing apparatus 500 uses the owned mobile phone as a viewing tool when a large volume of texts created with a personal computer or the like need to be read within a limited period of time. Accordingly, complexity of the operations is eliminated, and texts can be efficiently viewed.

Also, since the mobile phone is likely to be carried around all the time, texts can be viewed anytime, and it is possible to make effective use of time (at higher efficiency).

When a text is viewed on the mobile phone, an electronic text is displayed in the format easiest for the user to read. Also, the electronic text can be displayed at a speed matching the fast reading skill of the user. Accordingly, it is possible to make more effective use of time (at higher efficiency).

Figure 6:
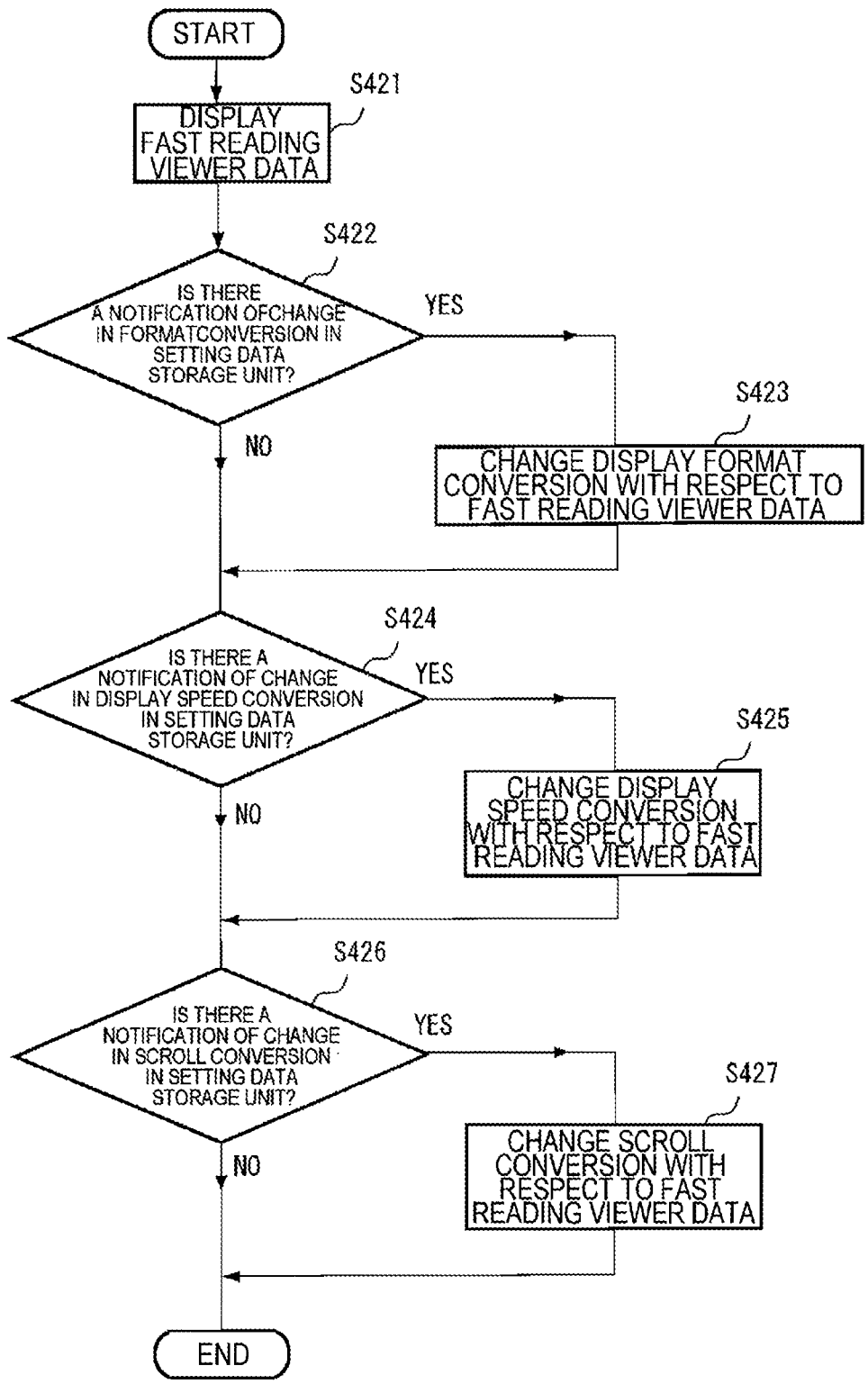
FIG. 6 is a flowchart showing an operation to be performed to change the setting data set for the fast reading viewer.

Next, an operation to be performed to change the setting data about a fast reading viewer displayed on the electronic text viewing apparatus 500 is described. FIG. 6 is a flowchart showing the operation to be performed by the electronic text viewing apparatus 500 to change the fast reading viewer.

As shown in FIG. 6, at step S421, fast reading viewer data is transmitted from the fast reading viewer control unit 103 to the display unit 300, and the display unit 300 displays the fast reading viewer data.

At step S422, the fast reading viewer control unit 103 determines whether there is a notification of a display format conversion change from the setting data storage unit 102. When there is not a notification of a display format conversion change from the setting data storage unit 102 ("NO" at step S422), the fast reading viewer control unit 103 moves on to step S424.

When there is a notification of a display format conversion change from the setting data storage unit 102 ("YES" at step S422), the fast reading viewer control unit 103 refers to the setting data storage unit 102 with respect to the fast reading viewer data, and makes the corresponding display format conversion change (step S423).

The fast reading viewer control unit 103 then determines whether there is a notification of a display speed conversion change from the setting data storage unit 102 (step S424). When there is not a notification of a display speed conversion change from the setting data storage unit 102 ("NO" at step S424), the fast reading viewer control unit 103 moves on to step S426.

When there is a notification of a display speed conversion change from the setting data storage unit 102 ("YES" at step S424), the fast reading viewer control unit 103 refers to the setting data storage unit 102 with respect to the fast reading viewer data, and makes the corresponding display speed conversion change (step S425).

The fast reading viewer control unit 103 then determines whether there is a notification of a scroll conversion change from the setting data storage unit 102 (step S426). When there is not a notification of a scroll conversion change from the setting data storage unit 102 ("NO" at step S426), the operation of the fast reading viewer control unit 103 comes to an end.

When there is a notification of a scroll conversion change from the setting data storage unit 102 ("YES" at step S426), the fast reading viewer control unit 103 refers to the setting data storage unit 102 with respect to the fast reading viewer data, and makes the corresponding scroll conversion change (step S427). The operation then comes to an end.

As described above, according to this exemplary embodiment, the electronic text viewing apparatus 500 can perform a display format conversion on the text of viewing data, when the viewing data and the fast reading button are displayed, and the fast reading button is pressed.

The fast reading viewer control unit 103 performs display speed conversion control on the electronic text subjected to the display format conversion. The fast reading viewer control unit 103 also performs scroll conversion control on the electronic text controlled through the display speed conversion. The electronic text controlled through the scroll conversion is then displayed as fast reading viewer data together with the return button 200A on the display unit 300.

When the return button 200A is pressed, the electronic text viewing apparatus 500 switches the fast reading viewer data display to the viewing data display. Accordingly, when a large volume of texts created with a personal computer or the like need to be read within a limited period of time, complexity of the operations is eliminated, and the electronic texts can be efficiently viewed. Also, the electronic text viewing apparatus 500 can be mounted on a mobile phone that is always carried around all the time. Accordingly, the mobile phone can be used as a viewing tool, and it is possible to make effective use of time by virtue of the convenience of the mobile phone.

When an electronic text is viewed with a mobile phone, the electronic text is displayed in a format such as a fast reading viewer that is the easiest for the user to read, and is also displayed at a speed that matches the fast reading skill of the user. Accordingly, it is possible to make more effective use of time.

When viewing data contains a drawing or picture, a display format conversion is performed on an electronic text formed by extracting only the text portion of the viewing data. Accordingly, it is possible to make more effective use of time.

Furthermore, the electronic text viewing apparatus 500 can readily return to the viewing data screen from the fast reading viewer. Accordingly, the drawing or picture that has not been extracted can be viewed.

When there is a change in the setting data about display format conversions, display speed conversions, and scroll conversions, the setting data about the fast reading viewer can be readily changed. Accordingly, the fast reading viewer can be made easier to see.

According to this exemplary embodiment, when the font size of an electronic text being read by a user with the fast reading viewer is to be made larger or smaller, or when the display speed of the electronic text is to be made lower or higher, or when the scrolling is to be switched from page scrolling to row scrolling or vice versa, the conditions for fast reading can be readily changed. Accordingly, the user can adjust the fast reading viewer to his/her liking, and make it easier to see.

This application is the National Phase of PCT/JP2008/003205, filed on Nov. 6, 2008, which claims priority based on Japanese Patent Application No. 2007-300023, filed on Nov. 20, 2007, the contents of which are incorporated hereinto by reference.

For example, a fast reading viewer according to the present invention is a fast reading viewer that facilitates viewing of a text, and characteristically includes: a display unit that displays viewing data and a fast reading button or displays fast reading viewer data and a return button; a viewing application unit that causes the display unit to display the viewing data; a setting data storage unit that sets and stores information data that is designed for performing a display format conversion, a display speed conversion, and a scroll conversion on the text; a fast reading viewer control unit that converts the viewing data output from the application into fast reading viewer data by referring to the setting data storage unit, performing a display format conversion, controlling the display speed, and performing scroll control, and causes the display unit to display the converted fast reading viewer data; and a viewing data requesting unit that issues a request for acquirement of the viewing data to the viewing application unit to output the viewing data to the fast reading viewer control unit when the fast reading button on the screen displayed on the display unit is pressed and a fast reading request is input, and issues a request for display of the viewing data output from the application unit on the display unit when the return button on the screen displayed on the display unit is pressed and a viewing request is input.

In the fast reading viewer according to the present invention, the setting data storage unit may store the selection data about vertical/horizontal display, the selection data about the used font, the selection data about the font size, and the selection data about the spacing of lines, as the information data for performing a display format conversion, may also store the selection data about the display speed as the information data for performing a display speed conversion, and may further store the selection data about page scrolling or row scrolling as the information data for performing a scroll conversion.

In the fast reading viewer according to the present invention, when the viewing data that is output from the application contains a drawing or picture, the fast reading viewer control unit may extract only the text portion and convert the extracted text into fast reading viewer data by referring to the setting data storage unit.

In the fast reading viewer according to the present invention, when the fast reading button displayed on the display unit is pressed, the display may be switched from the viewing data to the fast reading viewer data, and, when the return button displayed on the display unit is pressed, the display may be switched from the fast reading viewer data to the viewing data.

In the fast reading viewer according to the present invention, when there is a change in the information data stored in the setting data storage unit, the setting data storage unit may notify the fast reading viewer control unit of the change, and the fast reading viewer control unit may make a change to the converted fast reading viewer data.

For example, a fast reading viewer formation method according to the present invention is a fast reading viewer formation method for facilitating text viewing, and characteristically includes: displaying viewing data and a fast reading button; performing a display format conversion on the text in the viewing data when the fast reading button is pressed; performing display speed control on the text subjected to the display format conversion; performing scroll control on the text subjected to the display speed control; displaying the text subjected to the scroll control as fast reading viewer data together with a return button; and switching the display from the fast reading viewer data to the viewing data when the return button is pressed.

By the fast reading viewer formation method according to the present invention, when the viewing data contains a drawing or picture in performing a display format conversion on the text of the viewing data, only the text portion may be extracted, and a display format conversion may be performed on the extracted text.

For example, a fast reading viewer formation program according to the present invention is a fast reading viewer formation program for facilitating text viewing, and characteristically includes: displaying viewing data and a fast reading button; performing a display format conversion on the text in the viewing data when the fast reading button is pressed; performing display speed control on the text subjected to the display format conversion; performing scroll control on the text subjected to the display speed control; displaying the text subjected to the scroll control as fast reading viewer data together with a return button; and switching the display from the fast reading viewer data to the viewing data when the return button is pressed.

By the fast reading viewer formation program according to the present invention, when the viewing data contains a drawing or picture in performing a display format conversion on the text of the viewing data, only the text portion may be extracted, and a display format conversion may be performed on the extracted text.

For example, a mobile phone according to the present invention is a mobile phone that facilitates text viewing, and characteristically includes: a display unit that displays viewing data and a fast reading button or displays fast reading viewer data and a return button; a viewing application unit that causes the display unit to display the viewing data; a setting data storage unit that sets and stores information data that is designed for performing a display format conversion, a display speed conversion, and a scroll conversion on the text; a fast reading viewer control unit that converts the viewing data output from the application into fast reading viewer data by referring to the setting data storage unit, performing a display format conversion, controlling the display speed, and performing scroll control, and causes the display unit to display the fast reading viewer data; and a viewing data requesting unit that issues a request for acquirement of the viewing data to the viewing application unit to output the viewing data to the fast reading viewer control unit when the fast reading button on the screen displayed on the display unit is pressed and a fast reading request is input, and issues a request for display of the viewing data from the application unit on the display unit when the return button on the screen displayed on the display unit is pressed and a viewing request is input.

In the mobile phone according to the present invention, when the viewing data that is output from the application unit contains a drawing or picture, the fast reading viewer control unit may extract only the text portion and convert the extracted text into fast reading viewer data by referring to the setting data storage unit. Industrial Usability The present invention can be applied to electronic text viewing apparatuses for viewing electronic data, mobile phones, PHS (Personal Handyphone Systems), PDA (Personal Digital Assistants), and the likes.

The invention claimed is:

1. An electronic text viewing apparatus comprising:
a viewing request acceptance unit configured to accept a viewing request to a viewing application and determines which one of a plurality of viewing applications is requested, said viewing applications respectively outputting viewing data to be displayed in a viewable manner;
a display unit configured to display said viewing data outputted by said viewing application corresponding to the accepted viewing request;
a viewing data requesting unit configured to issue a request for acquirement of said viewing data to said viewing application corresponding to the accepted viewing request, acquires said viewing data to be viewed from said viewing application, and causes said display unit to display the acquired viewing data;
a setting data storage unit configured to store setting data for use to convert said viewing data into a fast reading viewer data by performing a display format conversion, a display speed control, and a scroll control on the text of said viewing data acquired;
a fast reading request acceptance unit configured to make said display unit display said viewing data outputted by said viewing application and a fast reading button for receiving a fast reading request for said viewing data outputted from said viewing application and displayed, and accepts said fast reading request by an operation of said fast reading button; and
a fast reading viewer control unit configured, when said fast reading request is accepted, to extract said text from said viewing data acquired by said viewing data requesting unit, to perform the display format conversion for the extracted text by referring to and using said setting data stored to create the fast reading viewer data, to display speed or scrolling of said fast reading viewer data being controlled according to said setting data, and to display said fast reading viewer data and a return button for making said display unit switch a display from said fast reading viewer data to said viewing data corresponding to the viewing data outputted from the viewing application which has been converted into the fast reading viewer data and displayed before converting,
wherein:
when said viewing data that is output from said viewing application contains a drawing or picture, said fast reading viewer control unit extracts only a text portion from said viewing data, refers to said setting data storage unit for said text extracted, and converts said text extracted into said fast reading viewer data, and when said return button is operated, said display unit switches a display from said fast reading viewer data including only the extracted text and said return button to said viewing data corresponding to the original acquired viewing data outputted from the viewing application and the fast reading button,
said fast reading viewer control unit selectively displays data in different display screen layouts based on whether the fast reading request is accepted, such that the fast reading viewer control unit controls the display unit to display the fast reading viewer data in accordance with the setting data in a first display screen layout when the fast reading request is accepted and controls the display unit to display the viewing data in a second display screen layout when there is no fast reading request, the first display screen layout being different from the second display screen layout,
the plurality of viewing applications comprise at least two of applications that enable viewing data from mail, browsers, documents, and electronic books, and
each of the plurality of viewing applications displays said viewing data in a different format.

2. The electronic text viewing apparatus as claimed in claim 1, wherein
said setting data storage unit stores at least one of selection data about vertical or horizontal display, selection data about a font used, selection data about a font size, and selection data about spacing of lines, as setting data for performing said display format conversion,
said setting data storage unit stores selection data about display speed as selection data for performing said display speed conversion, and
said setting data storage unit stores selection data about page scrolling or row scrolling as information data for performing said scroll conversion.

3. The electronic text viewing apparatus as claimed in claim 1, wherein
when said fast reading button displayed is selected, the display is switched from said viewing data to said fast reading viewer data, and
when said return button displayed is selected, said display is switched from said fast reading viewer data to said viewing data.

4. The electronic text viewing apparatus as claimed in claim 1, wherein
when there is a change in said setting data stored in said setting data storage unit,
said setting data storage unit notifies said fast reading viewer control unit that there is a change in said setting data, and
said fast reading viewer control unit makes a change to said setting data with respect to said fast reading viewer data.

5. An electronic text viewing method comprising:
accepting a viewing request to a viewing application and determines which one of a plurality of viewing applications is requested, the viewing applications respectively outputting viewing data to be displayed in a viewable manner;
displaying said viewing data outputted by the viewing application corresponding to the accepted viewing requests;

in said viewing application, issuing a request for acquirement of said viewing data corresponding to the accepted request, to acquire said viewing data to be viewed from the viewing application, and causing said display unit to display the acquired viewing data;

storing setting data for use to convert said viewing data into a fast reading viewer data that is used for performing a display format conversion, a display speed control, and a scroll control on the text of said viewing data acquired; and displaying said viewing data outputted by said viewing application;

receiving a fast reading request for said viewing data outputted from said viewing application and displayed and accepting said fast reading request by an operation of said fast reading button; when said fast reading is accepted, extracting said text from said viewing data acquired, performing the display format conversion for the extracted text by referring and using to said stored setting data to create the fast reading viewer data, displays speed or scrolling of said fast reading viewer data being controlled according to said setting data, and displaying said fast reading viewer data and a return button for making a display unit switch from said fast reading viewer data to said viewing data corresponding to the viewing data outputted from the viewing application which has been converted into the fast reading viewer data and displayed before converting, and selectively displaying data in different display screen layouts based on whether the fast reading request is accepted, such that the fast reading viewer control unit controls the display unit to display the fast reading viewer data in accordance with the setting data in a first display screen layout when the fast reading request is accepted and controls the display unit to display the viewing data in a second display screen layout when there is no fast reading request, the first display screen layout being different from the second display screen layout, and wherein:
when said viewing data that is output from said viewing application contains a drawing or picture, extracting only a text portion from said viewing data, referring to said setting data storage unit for said text extracted, and converting said text extracted into said fast reading viewer data, and when said return button is operated, said display unit switches a display from said fast reading viewer data including only the extracted text and said return button to said viewing data corresponding to the original acquired viewing data outputted from the viewing application and the fast reading button, the plurality of viewing applications comprise at least two of applications that enable viewing data from mail, browsers, documents, and electronic books, and each of the plurality of viewing applications displays said viewing data in a different format.

6. A mobile phone comprising:

a viewing request acceptance unit configured to accept a viewing request to a viewing application and determines which one of a plurality of viewing applications is requested, said viewing applications respectively outputting viewing data to be displayed in a viewable manner;

a display unit configured to display said viewing data output by said viewing application corresponding to the accepted viewing request;

a viewing data requesting unit configured to issue a request for acquirement of said viewing data to said viewing application unit corresponding to the accepted viewing request, acquires said viewing data to be viewed from said viewing application, and causes said display unit to display the acquired viewing data;

a setting data storage unit configured to store setting data for use to convert said viewing data into a fast reading viewer data by performing a display format conversion, a display speed control, and a scroll control on the text of said viewing data acquired;

a fast reading request acceptance unit configured to make said display unit display said viewing data outputted by said viewing application and a fast reading button for receiving a fast reading request for said viewing data outputted from said viewing application and displayed, and accepts said fast reading request by an operation of said fast reading button; and a fast reading viewer control unit configured, when said fast reading request is accepted, to extract said text from said viewing data acquired by said viewing data requesting unit, to perform the display format conversion for the extracted text by referring to and using said setting data stored to create the fast reading viewer data, to display speed or scrolling of said fast reading viewer data being controlled according to said setting data, and to display said fast reading viewer data and a return button for making said display unit switch a display from said fast reading viewer data to said viewing data corresponding to the viewing data outputted from the viewing application which has been converted into the fast reading viewer data and displayed before converting, wherein:
when said viewing data that is output from said viewing application unit contains a drawing or picture, said fast reading viewer control unit extracts only a text portion from said viewing data, refers to said setting data storage unit for said text extracted, and converts said text extracted into said fast reading viewer data, and when said return button is operated, said display unit switches a display from said fast reading viewer data including only the extracted text and said return button to said viewing data corresponding to the original acquired viewing data outputted from the viewing application and the fast reading button, said fast reading viewer control unit selectively displays data in different display screen layouts based on whether the fast reading request is accepted, such that the fast reading viewer control unit controls the display unit to display the fast reading viewer data in accordance with the setting data in a first display screen layout when the fast reading request is accepted and controls the display unit to display the viewing data in a second display screen layout when there is no fast reading request, the first display screen layout being different from the second display screen layout, the plurality of viewing applications comprise at least two of applications that enable viewing data from mail, browsers, documents, and electronic books, and each of the plurality of viewing applications displays said viewing data in a different format.

* * * * *